United States Patent [19]

Huntsinger

[11] 4,091,381

[45] May 23, 1978

[54] DIGITAL INDICATION FOR SELECTABLE IMPEDANCE CIRCUIT

[75] Inventor: Dean P. Huntsinger, Marion, Iowa

[73] Assignee: Rockwell International Corporation, El Segundo, Calif.

[21] Appl. No.: 702,372

[22] Filed: Jul. 2, 1976

[51] Int. Cl.² ............................................. H03K 13/03
[52] U.S. Cl. ............................... 340/347 AD; 324/98; 324/DIG. 1; 340/347 M
[58] Field of Search .... 340/347 AC, 347 M, 347 CC, 340/347 SH, 347 NT; 324/99 D, 62–64, DIG. 1, 98

[56] References Cited

U.S. PATENT DOCUMENTS

| | | | |
|---|---|---|---|
| 3,711,850 | 1/1973 | Kelly | 340/347 NT |
| 3,713,136 | 1/1973 | Nagy | 340/347 NT |
| 3,728,626 | 4/1973 | Douglas et al. | 324/62 R |
| 3,982,241 | 9/1976 | Lipcon | 340/347 CC |

OTHER PUBLICATIONS

Motorola Semiconductors' Specifications and Applications Information, MC1507L, pp. 1, 10 & 11.
The Engineering Staff of Analog Devices, Inc., Analog Digital Conversion Handbook, 6/1972, pp. III-1 to III-18.

Primary Examiner—Thomas J. Sloyan
Attorney, Agent, or Firm—H. Fredrick Hamann; Howard R. Greenberg

[57] ABSTRACT

A digital indication for a selectable impedance circuit consisting of a plurality of serially connected impedances and a selector which is connectable to a common junction of any of them is provided by connecting an electric signal source to the end terminals of the circuit to develop a signal between the selector and at least one of the end terminals which is compared with the output of a digital/analog converter, the converter being connected to the output of a digital counter which continues to receive clock pulses until disabled from doing so by a comparison difference within a predetermined tolerance.

13 Claims, 1 Drawing Figure

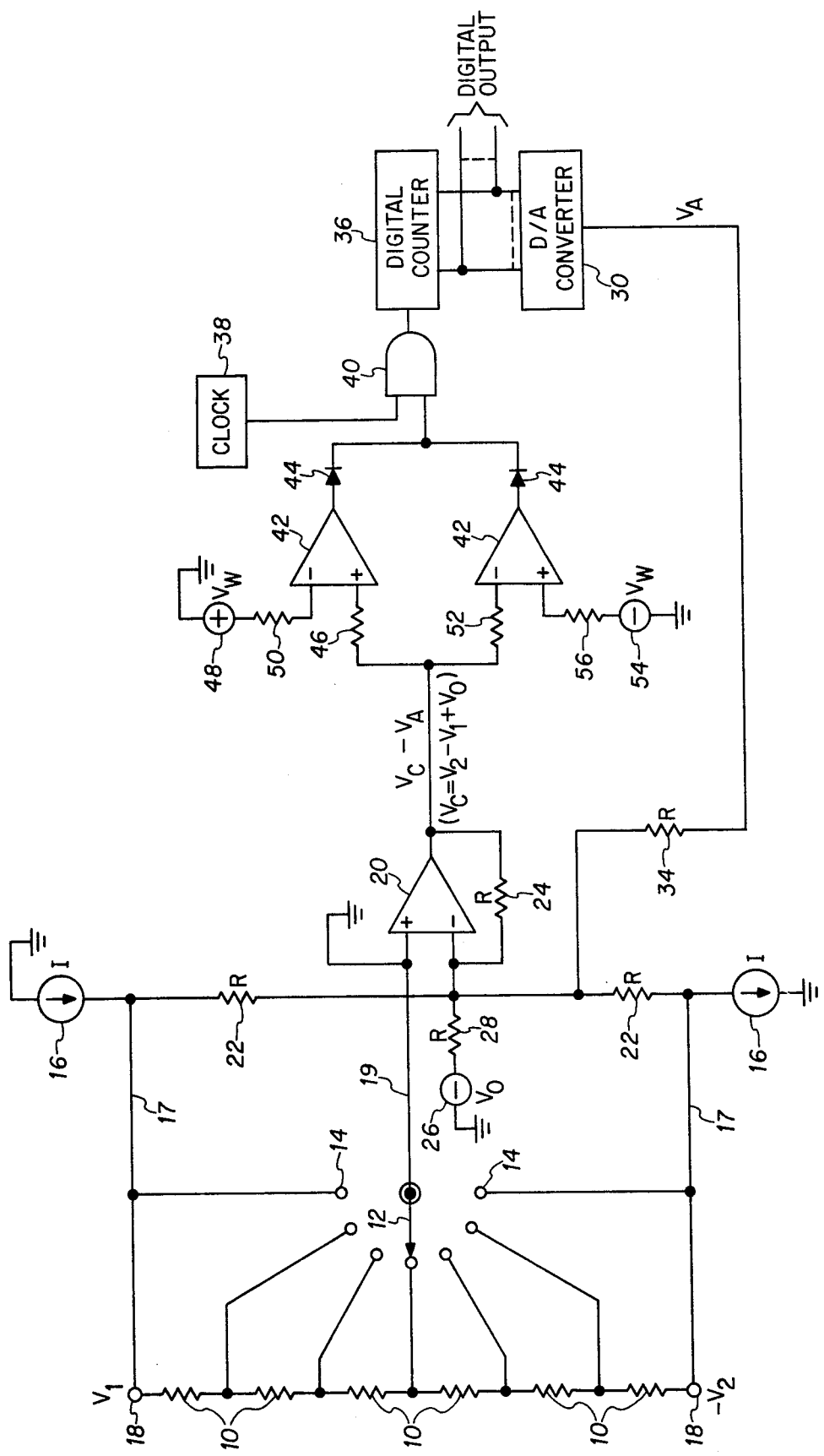

DIGITAL INDICATION FOR SELECTABLE IMPEDANCE CIRCUIT

BACKGROUND OF THE INVENTION

The present invention pertains generally to selectable impedance circuits for effectuating control functions and specifically to a digital technique employable therewith.

Whenever equipment is to be controlled from a remote location to effectuate some mechanical control movement, it is common practice to employ an electrical feedback loop such as in a servo system whereby an electrical sensing signal at the controlled location changes in accordance with the desired mechanical motion thereat until brought into correspondence with an electrical control signal generated at the controlling location indicative of the mechanical change desired by the operator. One typical arrangement utilizes a bridge circuit comprising a pair of selectable impedance circuits consisting of a plurality of serially connected impedances and a selector which is connectable to any common junction of the impedances. With the end terminals of the circuits connected together to an electric signal source, one circuit is located at the controlling location while the other circuit is located at the controlled location to afford the desired remote control. By mechanically linking the controlled circuit selector to the mechanically controlled device and providing a position sensing signal thereat, the desired mechanical movement can be achieved by permitting the adjustment of the aforesaid selector until a null point which no longer effectuates the mechanical movement is attained upon comparison of the sensing signal with the electric control signal resulting from the setting of the controlling circuit selector. The foregoing arrangement is often found in avionics equipment wherein control knobs in the cockpit of the plane are adjusted to tune radios to desired frequencies either for voice communication or navigation purposes.

With the proliferation of digital electronics, particularly in radio communications, the economics of modernizing equipment often dictate partial conversion without revamping the entire system. For example, in the remote control scheme alluded to in the preceding paragraph, it is not uncommon to justify conversion to avionics digital radio equipment only when the retrofit of the controlling equipment in the cockpit of the plane can be avoided. Consequently, a primary object of the present invention is to provide a digital indication for use with a selectable impedance control type circuit to afford digital rather than analog signals for effectuating control of digital type equipment.

It is a further object of the present invention to provide such a digital indication with a minimum of equipment so as to ameliorate the descriptive modification effects to existing equipment when retrofitting same.

The foregoing objects as well as others and the means by which they are achieved through the present invention may best be appreciated by referring to the Detailed Description of the Preferred Embodiment which follows hereinafter together with the single figure of the attached drawing which depicts the functional block elements of the invention.

BRIEF DESCRIPTION OF THE INVENTION

In accordance with the stated objects, a digital indication for a selectable impedance circuit is provided by connecting to the end terminals of the serially connected impedances which comprise the circuit an electric signal source. The signal developed between the selector, which is connectable to any common junction of the impedances of the circuit, and at least one of the end terminals of the circuit is compared with the output of a digital/analog converter whose input is connected to the output of a digital counter, the digital output thereof providing the desired digital indication. The counter is driven by clock pulses so long as there is no correspondence in the signal developed at the output of the converter and the impedance circuit. Once there is correspondence within any desired predetermined tolerance, the counter is disabled from receiving any further clock pulses, thereby holding the digital output signal at the desired level.

In the preferred embodiment, the electric signal source comprises two current generators, each being connected between the selector and a different end terminal of the impedance circuit with a polarity opposite to the other and the comparator means for comparing the output of the digital/analog converter with the output of the impedance circuit comprises summing means for adding together the two signals developed between the selector and the respective end terminals of the circuit before any comparison is made so as to eliminate or at least ameliorate any adverse signal interferences. The comparator means further includes a window comparator comprising two threshold circuits for enabling clock pulses to be applied to the counter, each threshold so enabling when the output of the summing means exceeds the digital/analog converter output by more than the desired tolerance with a different polarity.

DETAILED DESCRIPTION OF THE PREFERRED EMBODIMENT

The selectable impedance circuit of the attached single drawing FIGURE comprises a plurality of serially connected impedances such as resistors 10 and a selector 12 which is connected to the equipment ground and can be rotated by a mechanical knob (not shown) to contact any of the common junctions 14 of the resistors 10. Each of a pair of like grounded current generators 16, which may take any well known form, is connected to a different end terminal 18 of the circuit with a polarity opposite to the other so that current I flows out of the upper current generator 16 into the impedance circuit to produce a positive voltage $V_1$ with respect to the selector 12 while current I flows into the lower generator 16 from the circuit to produce a negative voltage $V_2$ with respect to the selector 12. Since the selectable impedance circuit and the current generators 16 would ordinarily be located at separated controlling and controlled locations, respectively, it is to be noted that the length of interconnecting leads 17 and lead 19 connecting selector 12 to the equipment ground can be considerable depending upon the physical separation between those locations. It is to be further noted that by using the same resistance values for all of the resistors 10, a linear arrangement is realized whereby the same voltage gradient is produced across each of the resistors 10 so that as the selector 12 is rotated from one common junction 14 to the next adjacent one, the same incremental voltage is always added to one of the voltages $V_1$ or $V_2$ as subtracted from the other.

The selector 12 is connected to the grounded positive (+) input of an operational amplifier 20 with the end terminals 18 of the impedance circuit being connected to its negative (−) input through individual resistors 22. With a feedback resistor 24 connected between the output and negative input of the operational amplifier 20, having a resistance value R equal to that of resistors 22, it will be readily seen that the output of amplifier 20 is equal to the inverted sum of $V_1$ and $-V_2$ or $V_2 - V_1$ (it being understood that the resistance values may be tailored for any desired gain and are assumed equal to the same value R herein only for the sake of simplicity).

Since the combination of signals developed by the impedance circuit at the output of summing amplifier 20 may be either positive or negative depending upon the setting for selector 12 and since it is desirable to operate with a unipolar signal to the extent possible, a $-V_0$ grounded offset voltage source 26 may also be connected to the negative input of amplifier 20 through a resistor 28 having a value R so as to produce a positive voltage $V_0$ at the output of amplifier 20. If $V_0$ is made equal to the maximum absolute voltage for $V_1$ and $V_2$ (selector 12 at topmost or bottommost junction 14, respectively) then the output of amplifier 20 will always be positive ranging from 0 when the selector 12 is connected to the bottommost junction 14 and $2V_0$ when it is connected to the topmost junction 14. For simplicity, the sum of $V_2 - V_1 + V_0$ is designated $V_C$.

A fourth input to the negative input of amplifier 20 is derived from the analog output $V_A$ of a digital/analog converter 30 through a resistor 34 having the resistance value R. Thus, the output of amplifier 20 is $V_C - V_A$. The input of the digital/analog converter 30 is connected to the output of a digital counter 36 which receives clock pulses from a clock source 38 via one input of an AND gate 40 when AND gate 40 is enabled by a high logic level (one) signal applied to a second input thereof. The second input of AND gate 40 is connected to the output of two operational amplifiers 42, functioning as individual threshold circuits, through isolating diodes 44. The upper amplifier 42 has its positive input connected to the output of amplifier 20 through a resistor 46 while its negative input is connected to a positive grounded voltage source 48 of potential $V_W$ through a resistor 50. The lower amplifier 42 has its negative input connected to the output of amplifier 20 through a resistor 52 while its positive input is connected to a negative grounded voltage source 54 of potential $V_W$ through a resistor 56. It will be readily seen that when $V_C$ differs from $V_A$ by an amount greater than $V_W$ and its polarity is positive with respect to $V_A$, the output of the upper amplifier 42 is high so as to enable AND gate 40 to pass clock pulses to the digital counter 36. As a consequence, the analog output $V_A$ of the digital/analog converter 30 will change in accordance with the digital output of counter 36 until it differs from $V_C$ by the amount $V_W$ at which time the output of amplifier 42 goes low so as to disable AND gate 40 thereby inhibiting the counter 36 from receiving any further counting pulses from clock 38. Thus, the digital output of counter 36 remains at that fixed level which is the desired digital indication counterpart for $V_A$ as determined by $V_C$. Similarly, if $V_C$ differs from $V_A$ by an amount greater than $V_W$ and its polarity is negative with respect to $V_A$, the lower amplifier 42 will generate a high output so as to enable AND gate 40 to pass clock pulses to digital counter 36 thereby driving the output $V_A$ of digital/analog converter 30 to a value which will likewise narrow the difference to $V_W$ at which time the output of the lower amplifier 42 will change to a low level signal so as to disable AND gate 40, thereby holding the digital output of counter 36 at the desired level. Thus, the upper and lower amplifiers 42 constitute a window comparator for inhibiting the digital counting operation whenever the difference between the analog output $V_A$ of the digital/analog converter 30 and $V_C$ exceeds $V_W$ and irrespective of whether or not $V_C$ is positive with respect to $V_A$ dependent on the direction of rotation of selector 12. It is of course realized that a less sophisticated comparison scheme employing a single threshold device could be employed if one were willing to forego an operational window which affords a correspondence tolerance of $V_W$ and rely instead on a zero signal difference as an indication that a match has been achieved.

It will be noted that a single current source could be used in lieu of the dual current source preferred. However, when the leads interconnecting the controlling and controlled locations are long as alluded to earlier, interfering signals induced in the leads will not be cancelled out as in the preferred embodiment and thus would degrade performance. This is often a problem with avionics electronics equipment.

As the subject disclosure demonstrates, the subject invention provides a digital indication for use with a selectable impedance circuit that minimizes the requisite equipment so as to ameloriate descriptive modification effects associated with retrofitting equipment. Since modifications to the foregoing preferred embodiment are possible without departing from the scope and spirit of the invention, the disclosure is intended to be merely exemplary and not circumscriptive of the invention as it will now be claimed hereinbelow.

What is claimed is:

1. A digital indicating method for a selectable impedance circuit consisting of a plurality of serially connected impedances and a selector for selectably connecting to a common terminal the junction of any of the impedances, comprising:
   passing like electric currents between the common terminal and each end terminal of the circuit;
   subtractively combining the signals developed between the common terminal and the two respective end terminals of the circuit;
   generating a series of clock pulses;
   digitally counting said clock pulses in the presence of an enable signal;
   converting the digital count to an analog equivalent signal, and
   comparing said analog equivalent signal to said subtractively combined signal and generating said enable signal when they differ by more than a predetermined amount.

2. A digital indicator for a selectable impedance circuit consisting of a plurality of serially connected impedances and a selector for selectably connecting to a common terminal the junction of any of the impedances, comprising:
   an electric signal source consisting of two like current generators, each being connected between the common terminal and a different end terminal of the circuit;
   arithmetic means for subtractively combining the signals developed between the common terminal and the two respective end terminals of the circuit;
   a digital counter;
   a source of clock pulses;
   gating circuit means for passing said clock pulses to said counter when enabled;

a digital/analog converter having its input connected to the output of said counter, and comparator means for enabling said gating circuit means so long as the output of said arithmetic means and the output of said converter differ by more than a predetermined amount.

3. The digital indicator of claim 1 wherein all of the impedances have the same magnitude.

4. The digital indicator of claim 3 wherein said comparator means includes a window comparator connected to the output of said arithmetic means, said comparator means comprising a pair of threshold circuits for enabling said gating circuit means, each threshold circuit so enabling for a different polarity of signal at the output of said arithmetic means with respect to the output of said converter.

5. The digital indicator of claim 1 including a pair of wires, each for interconnecting a different end terminal of the circuit with one of said current generators and said arithmetic means and a common wire for interconnecting the common terminal with said signal source and said arithmetic means.

6. The digital indicator of claim 5 wherein said current generators are connected in opposite polarity and said arithmetic means is an operational amplifier having inverting and non-inverting inputs and said pair of wires and said common wire are respectively connected thereto.

7. The digital indicator of claim 6 wherein the output of said converter is also connected to the inverting input of said operational amplifier.

8. A digitalized selectable impedance circuit comprising:
a plurality of serially connected impedances;
a common terminal;
a selector for selectably connecting to said common terminal the junction of any of said impedances;
an electrical signal source consisting of two like current generators, each being connected between said common terminal and a different end terminal of said serially connected impedances;

arithmetic means for subtractively combining the signals developed between said common terminal and the two respective end terminals of said serially connected impedances;
a digital counter;
a source of clock pulses;
gating circuit means for passing said clock pulses to said counter when enabled;
a digital/analog converter having its input connected to the output of said counter, and
comparator means for enabling said gating circuit means so long as the output of said arithmetic means and the output of said converter differ by more than a predetermined amount.

9. The digitalized selectable impedance circuit of claim 8 wherein all of said impedances have the same magnitude.

10. The digitalized selectable impedance circuit of claim 9 wherein said comparator means includes a window comparator connected to the output of said arithmetic means, said comparator means comprising a pair of threshold circuits for enabling said gating circuit means, each threshold circuit so enabling for a different polarity of signal at the output of said arithmetic means with respect to the output of said converter.

11. The impedance circuit of claim 8 including a pair of wires, each for interconnecting a different end terminal of the circuit with one of said current generators and said arithmetic means and a common wire for interconnecting the common terminal with said signal source and said arithmetic means.

12. The impedance circuit of claim 11 wherein said current generators are connected in opposite polarity and said arithmetic means is an operational amplifier having inverting and non-inverting inputs and said pairs of wires and said common wire are respectively connected thereto.

13. The impedance circuit of claim 12 wherein output of said converter is also connected to the inverting input of said operational amplifier.

* * * * *

UNITED STATES PATENT AND TRADEMARK OFFICE
CERTIFICATE OF CORRECTION

PATENT NO. : 4,091,381
DATED : May 23, 1978
INVENTOR(S) : Dean P. Huntsinger

It is certified that error appears in the above-identified patent and that said Letters Patent are hereby corrected as shown below:

IN THE CLAIMS

Column 4, line 50, after "signal" insert -- developed between the selector and an end terminal of the circuit, --.

Column 5, line 7, after "claim" delete "1" and substitute therefor -- 2 --.

Column 5, line 17, after "claim" delete "1" and substitute therefor -- 2 --.

Column 5, line 38, delete "electrical" and substitute therefor -- electric --.

Column 6, line 35, delete "pairs" and substitute therefor -- pair --.

Signed and Sealed this

Twenty-fourth Day of October 1978

[SEAL]

Attest:

RUTH C. MASON
Attesting Officer

DONALD W. BANNER
Commissioner of Patents and Trademarks